(12) United States Patent
Krener-Iversen (10) Patent No.: US 11,886,083 B2
(45) Date of Patent: Jan. 30, 2024

(54) DIFFRACTION FREE COLOR MASK

(71) Applicant: Realfiction Lab ApS, København K (DK)

(72) Inventor: Steen Svendstorp Krener-Iversen, København K (DK)

(*) Notice: Subject to any disclaimer, the term of this patent is extended or adjusted under 35 U.S.C. 154(b) by 171 days.

(21) Appl. No.: 17/439,007

(22) PCT Filed: Mar. 16, 2020

(86) PCT No.: PCT/EP2020/057136
§ 371 (c)(1),
(2) Date: Sep. 14, 2021

(87) PCT Pub. No.: WO2020/187846
PCT Pub. Date: Sep. 24, 2020

(65) Prior Publication Data
US 2022/0146876 A1    May 12, 2022

(30) Foreign Application Priority Data
Mar. 15, 2019 (EP) .................... 19163283

(51) Int. Cl.
*G02F 1/1347* (2006.01)
*G02F 1/1335* (2006.01)
*G02B 30/26* (2020.01)
*G02F 1/13363* (2006.01)
*G02F 1/13357* (2006.01)
(Continued)

(52) U.S. Cl.
CPC .... *G02F 1/13473* (2013.01); *G02F 1/133607* (2021.01); *G02B 30/26* (2020.01); *G02F 1/133531* (2021.01); *G02F 1/133603* (2013.01); *G02F 1/133638* (2021.01); *G02F 2413/02* (2013.01); *G02F 2413/05* (2013.01); *G02F 2413/06* (2013.01); *H10K 59/12* (2023.02); *H10K 59/17* (2023.02)

(58) Field of Classification Search
None
See application file for complete search history.

(56) References Cited

U.S. PATENT DOCUMENTS

| 5,953,083 A | 9/1999 | Sharp |
| 2004/0169919 A1 | 9/2004 | Uehara et al. |
| 2012/0287504 A1 | 11/2012 | Jang et al. |

FOREIGN PATENT DOCUMENTS

| WO | 2005-057261 | * | 6/2005 |

* cited by examiner

*Primary Examiner* — Ashok Patel (57) ABSTRACT

A monochrome display is converted into a color display by including an electrically controllable planar color filter plate switchable between primary colors and operating the display in a color field sequential mode. Hence the requirement for a color switchable illumination source is eliminated. For example the illumination source may be a white OLED, an illumination type which, in combination with a microlens array, has proven well suited for directional displays. Further the need for a color mask is eliminated, thereby eliminating problems of moiree interference with a microlens array and further eliminating problems of diffraction patterns in infrared images captured through the display for example for observer tracking purposes. The electrically controllable planar color filter plate may comprise two wavelength dependent wave retarders and two liquid crystal cells.

33 Claims, 9 Drawing Sheets

(51) Int. Cl.
*H10K 59/12* (2023.01)
*H10K 59/17* (2023.01)

BY Filter

Fig. 3A

RC Filter

Fig. 3B

| 1st ELECTRIC SIGNAL | 2nd ELECTRIC SIGNAL | WAVELENGTH RANGE | COLOR |
| --- | --- | --- | --- |
| INACTIVE | INACTIVE | - | BLACK |
| INACTIVE | ACTIVE | 400 - 500 nm | BLUE |
| ACTIVE | INACTIVE | 590 - 700 nm | RED |
| ACTIVE | ACTIVE | 500 - 590 nm | GREEN |

DIFFRACTION FREE COLOR MASK

BACKGROUND

A monochrome directional display can be constructed by placing a microlens array over an OLED display so each microlens covers a number of pixels. In a display with a bottom emission OLED stack the microlenses may alternatively be comprised in the display substrate itself. The lens pitch of the microlens array may be selected so the microlenses are just small enough so they cannot be individually resolved by a human observer looking at the display from a normal viewing distance. The pixel pitch of the OLED display may be selected so there is a number of pixels behind each microlens, corresponding to the number of directions in which the display is capable of emitting light.

By illuminating a selected pixel behind a microlens, light will be emitted from the microlens in a direction corresponding to the position of the pixel. This can be used in for example an autostereoscopic or automultiscopic display where a right eye of an observer receives light from a first pixel behind a lens and a left eye of an observer receives light from a left eye of an observer. Hence the microlens is observed as a pixel having different brightness as observed with the left and the right eye. Using this principle in a multitude of pixels the display can show for example a left perspective image to the left eye and a right perspective image to the right eye.

A color directional display could be imagined by using the above described directional display and adding a color mask in the form of a substrate with a multitude of micro color filters located over the microlenses and by encoding the displayed images accordingly. However the color mask would have to be positioned very precisely over the microlenses and even so, the structures in the color mask would likely interfere with emitted light when the display is observed at angles not close to perpendicular, amongst others because the substrate would need a thickness at least in the same order of magnitude as a microlens diameter for manufacturing and handling reasons.

Another solution could be a color mask constructed from deposited dye spots on the OLED substrate or the microlens substrate itself, for example deposited between the substrate and a transparent electrode layer of the OLED structure, close to the microlenses and aligned with them to avoid moiree. But this would be a significant complication of the OLED manufacturing process.

Yet another solution could be to use a white OLED stack (WOLED stack) in the monochrome directional OLED display and use it as a directional white backlight unit for a color LCD display comprising a color mask with a multitude of small color filters and a black matrix, and operate the LCD display and the backlight unit in a synchronized time multiplexed scheme. However, the color filter pitch of the color mask in an LCD display is normally, like the lens pitch of the microlens array, selected so the color filters are just small enough so they cannot be individually resolved by a human observer looking at the display from a normal viewing distance. Hence the lens pitch and the color filter pitch are in the same order of magnitude and this can create a problem of disturbing moiree interference patterns since the observer looks at the light emitting OLED stack through both structures. A solution to that could be to make either the color filter pitch or the lens pitch much smaller so there is a difference of an order of magnitude, but both these solutions would increase the complexity of the construction an order of magnitude.

Additionally it may be desirable to include an infrared camera for an observer tracking and/or gaze tracking system providing tracking data used for controlling the directional backlight. This could be a pinhole camera interspersed between two microlenses in the backlight unit recording an infrared image of one or more observer(s) through the LCD display connected to a controller with observer and/or eye-tracking software directing the directional backlight. However, a problem is, that a diffraction pattern may be introduced when recording through a color mask comprising a black matrix which may make the observer and/or eye-tracking more complicated and/or less precise.

SUMMARY

It is an object of the invention to overcome the above mentioned problems of interference between a color mask and a directional backlight unit by eliminating the color mask and the black matrix in an LCD display located in front of a directional OLED backlight.

A microlens array is located on the light emitting surface of a white OLED display. A selected pixel behind a microlens is illuminated and light is emitted from the microlens in a direction corresponding to the position of the pixel which may be towards an eye of the observer. Further, an electrically controlled color filter is located in the optical path between the microlens and the observer. The electrically controlled filter is operated in a color field-sequential mode, synchronized with a modulation of the amplitude of emitted light from the pixel. Received light is time integrated on the retina of the observer's eye resulting in a desired color of the microlens being observed by the observer. The color field sequential mode is further combined with a time multiplexed autostereoscopic or automultiscopic mode rendering different images in different directions, for example left and right perspective images to the left and right eye of the observer respectively. The electrically controlled color filter comprises chromatic retarder films, polarizers and two LC modulators which are controlled by electrical color difference signals.

This configuration does not require any alignment of color filters to microlenses, complex manufacturing steps such as precisely depositing ink, and since no color mask is comprised, no moiree interference patterns between microlens array and color mask can occur.

DESCRIPTION

FIG. 1 shows a schematic illustration of an embodiment of a first configuration of the disclosed invention. FIGS. 1A and 2C shows a top view of the invention, with or without an indication of the illumination direction of the pixels, respectively. FIGS. 1B and 1D are almost identical to 1A and 1C respectively, except that the invention is seen in perspective.

At least a first eye 1 and a second eye 2 observe a light emitting display 3 comprising a plurality of pixels. In the optical path between the first eye 1 and the display 3 is located a microlens array 4 comprising a plurality of microlenses. The microlens array 4 may be located so the focal plane of the microlenses coincides essentially with a plane of a light emitting layer (not shown) in the display 3. The display 3 may be connected to a controller 5 capable of sending an electronic signal to a pixel in the display 3 so the pixel is illuminated and light emitted from it is transmitted through a microlens and where the pixel is located in a position such that the pixel is focused essentially at the first eye 1. The controller 5 may be capable of sending signals to a plurality of pixels such that light emitted from the plurality of pixels is essentially all focused at the first eye 1 and so that essentially no light is focused a second eye 2, and further, so that light observed by the eye 1 from the plurality of microlenses forms a first image perceived by the eye 1. Hence the controller 5 can essentially direct a first image to be shown to the first eye 1 and a dark display to the second eye. Similarly the controller may be capable of directing a second image to be shown to the second eye 2 and a dark display to the first eye. Likewise the controller may be capable of showing a third image to a third eye and dark to other eyes, a fourth image to a fourth eye and dark to other eyes, a fifth image to a fifth eye and dark to other eyes and so on.

A switchable color filter 6 may further be comprised. The switchable color filter 6 may be capable of transmitting selectively either red, green or blue light. The controller may be capable of directing the switchable color filter 6 to transmit essentially either red, green or blue light selectively.

The controller 5 may in a first time slot of a duty cycle direct a red color plane of the first image to be shown to the first eye 1 and dark to the second eye 2 and direct the switchable color filter 6 to transmit red light and in a second time slot direct a green color plane of the first image to be shown to the first eye 1 and dark to the second eye 2 and direct the switchable color filter 6 to transmit green light and in a third time slot direct a blue color plane of the first image to be shown to the first eye 1 and dark to the second eye 2 and direct the switchable color filter 6 to transmit blue light and in a fourth time slot direct a red color plane of the second image to be shown to the second eye 2 and dark to the first eye 1 and direct the switchable color filter 6 to transmit red light and in a fifth time slot direct a green color plane of the second image to be shown to the second eye 2 and dark to the first eye 1 and direct the switchable color filter 6 to transmit green light and in a sixth time slot direct a blue color plane of the second image to be shown to the second eye 2 and dark to the first eye 1 and direct the switchable color filter 6 to transmit blue light. The duty cycle may in a similar manner include more time slots and eyes.

The first image may show a first perspective rendering of an object or scene and the second image may show a second perspective rendering of the object or the scene. An eye tracking system (now shown) may further be comprised capable of sensing the position of the first eye 1 and updating the first image so the first perspective rendering essentially corresponds to the position of the first eye and sensing the position of the second eye 2 and updating the second image so the second perspective rendering essentially corresponds to the position of the second eye 2. In a similar manner the eye tracking system may sense positions of other eyes and update and show perspective renderings to them accordingly.

Figure 1A:
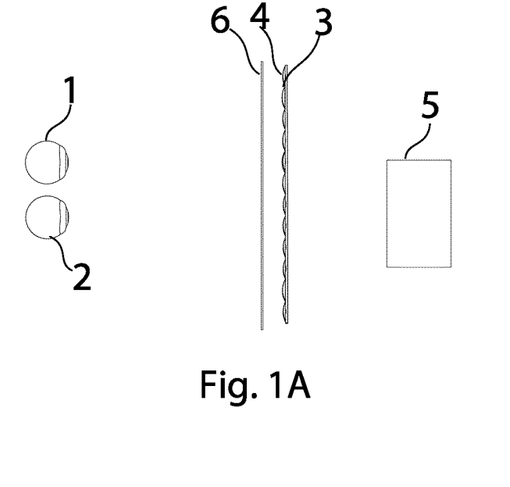
FIG. 1A illustrates a display according to an embodiment of the invention seen from the top.
Figure 1B:
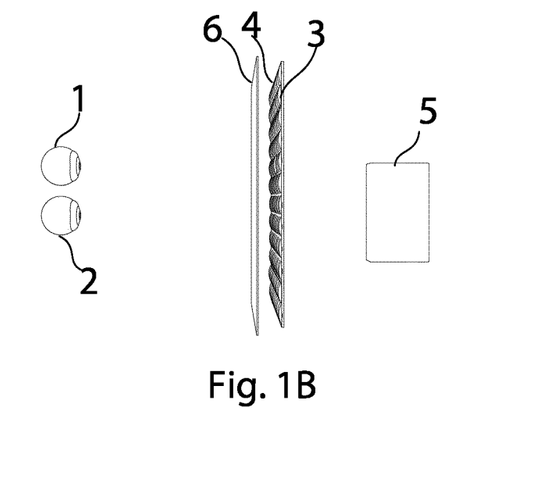
FIG. 1B illustrates a display according to an embodiment of the invention seen in a perspective top view.
Figure 1C:
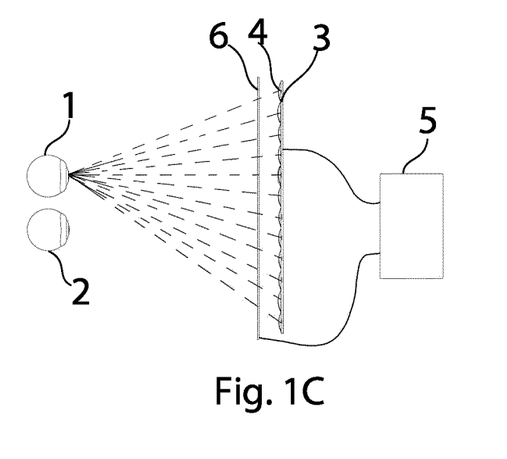
FIG. 1C illustrates a display according to an embodiment of the invention seen from the top.
Figure 1D:
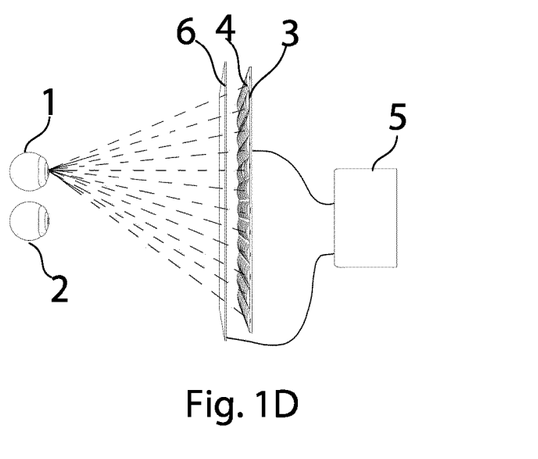
FIG. 1D illustrates a display according to an embodiment of the invention seen in a perspective top view.
Figure 2A:
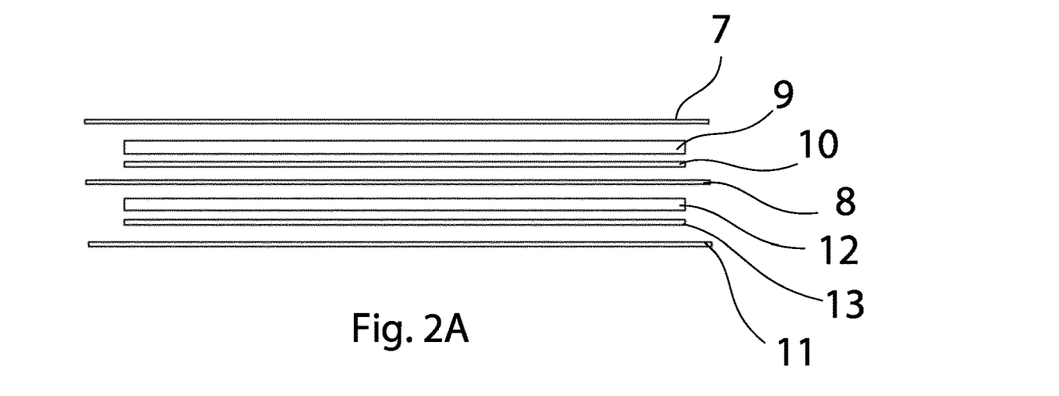
FIG. 2A illustrates a switchable color filter seen from the side.
Figure 2B:
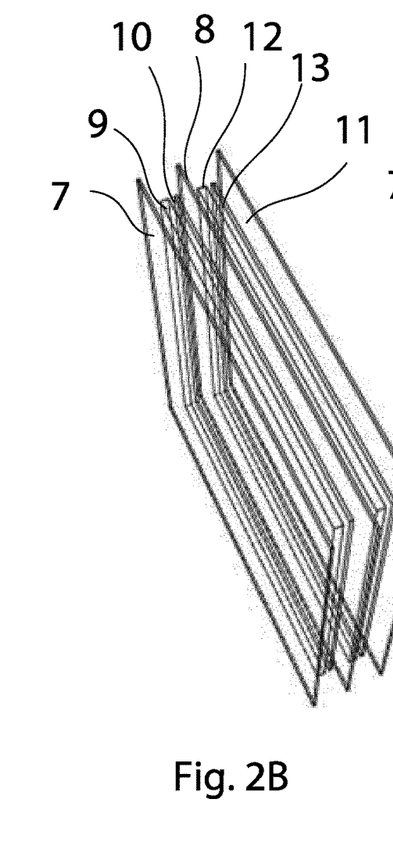
FIG. 2B illustrates a switchable color filter seen in a perspective view.
Figure 2C:
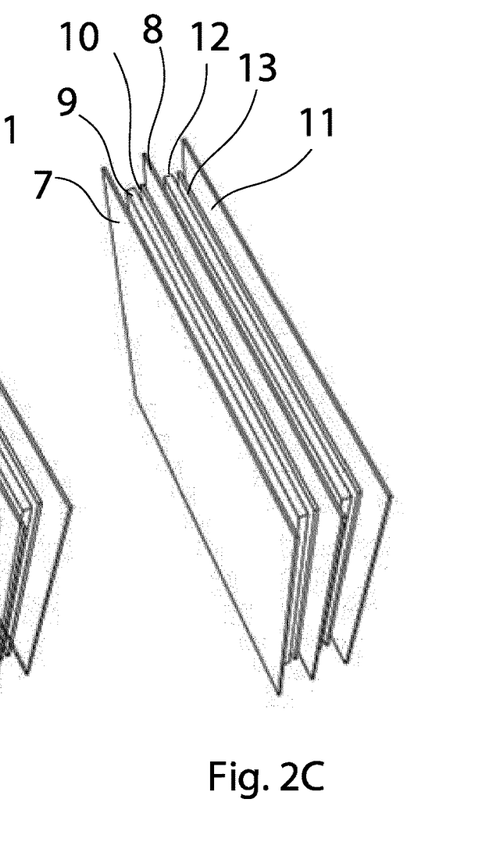
FIG. 2C illustrates a switchable color filter seen in a perspective view.

FIG. 2 is a schematic illustration of an embodiment of a configuration of the switchable color filter 6. FIG. 2A shows a side view, whereas FIGS. 2B and 2C are in perspective. FIG. 2B is a wireframe illustration. The switchable color filter 6 comprise a first absorbing linear polarizer 7 having a first polarization direction and a second absorbing linear polarizer 8 having a second polarization direction where said first polarization direction may be rotated 90 degrees with respect to said second polarization direction. Hence the first polarizer 7 and the second polarizer 8 may constitute a first set of crossed polarizers.

A first electrically controlled liquid crystal cell 9 and a first wavelength dependent half wave retarder plate 10 may be located between the first polarizer 7 and the second polarizer 8. The first liquid crystal cell 9 may be capable of rotating the polarization direction of transmitted visible light essentially 90 degrees when a first electric signal from the controller 5 is in an active state and of rotating the polarization direction of transmitted visible light essentially 0 degrees when the first electric signal is in an inactive state. The first electrically controlled liquid crystal cell 9 may essentially be independent of the wavelength of transmitted light within the visible spectrum. The first wavelength dependent half wave retarder plate 10 may be capable of essentially rotating the polarization direction of transmitted visible light either essentially 90 degrees or essentially 0 degrees depending on the color of the transmitted light. For example the first wavelength dependent half wave retarder plate 10 may rotate light with wavelengths essentially shorter than a first wavelength threshold by essentially 90 degrees and essentially not rotate light with wavelengths longer than the first wavelength threshold. Hence when the first electric signal from the controller 5 is in the inactive state then the first electrically controlled liquid crystal cell 9 does not alter the polarization of transmitted light while the first wavelength dependent half wave retarder plate 10 rotates light of wavelengths shorter than the first wavelength threshold by 0 degrees and thereby essentially only light of wavelengths essentially shorter than the first wavelength threshold can be transmitted through the crossed polarizers and when the first electric signal from the controller 5 is in the active state then the first electrically controlled liquid crystal cell 9 rotates the polarization direction by 90 degrees and the first wavelength dependent half wave retarder plate 10 rotates light with wavelengths essentially shorter than the first wavelength threshold 90 degrees, so light of wavelengths essentially shorter than the first wavelength threshold is subject to a total rotation of 180 degrees when travelling from the first polarizer 7 to the second polarizer 7 and thereby essentially only light of wavelengths longer than first wavelength threshold can be transmitted through the first set of crossed polarizers. The first wavelength threshold may be for example approximately 500 nm. Hence when the first electric signal is in an inactive state only blue light is transmitted through the first set of crossed polarizers and when the first electric signal is in an active state only yellow light is transmitted.

A third absorbing linear polarizer 11 may be comprised located at the opposite side of the second absorbing linear polarizer 8 than the first absorbing linear polarizer 7. Hence the second absorbing linear polarizer 8 and the third absorbing linear polarizer 11 may constitute a second set of crossed polarizers.

A second electrically controlled liquid crystal cell 12 and a second wavelength dependent half wave retarder plate 13 may be located between the second absorbing linear polarizer 8 and the third absorbing linear polarizer 11. The second electrically controlled liquid crystal cell 12, the second wavelength dependent half wave retarder plate 13, the second absorbing linear polarizer 8 and the third absorbing linear polarizer 11 may be capable of transmitting light of wavelengths below a second wavelength threshold if a second electric signal from the controller 5 is in an inactive state and of transmitting light of wavelengths above a second wavelength threshold if the second electric signal is in an active state. The second wave length threshold may be for example 590 nm. Hence when the second electric signal is in an inactive state only cyan light is transmitted through the second set of crossed polarizers and when the second electric signal is in an active state only red light is transmitted.

Hence, by setting the first electric signal and the second electric to different combinations of inactive and active states the controller can essentially select whether red light, green light, blue light or no light is transmitted through the switchable color filter 6.

The first electrically controlled liquid crystal cell 9 and the second electrically controlled liquid crystal cell 12 may comprised nematic or ferroelectric liquid crystals. They may for example be so-called pi-cells which are commercially available from many suppliers worldwide for example LC Tec AB in Sweden.

Figure 3A:
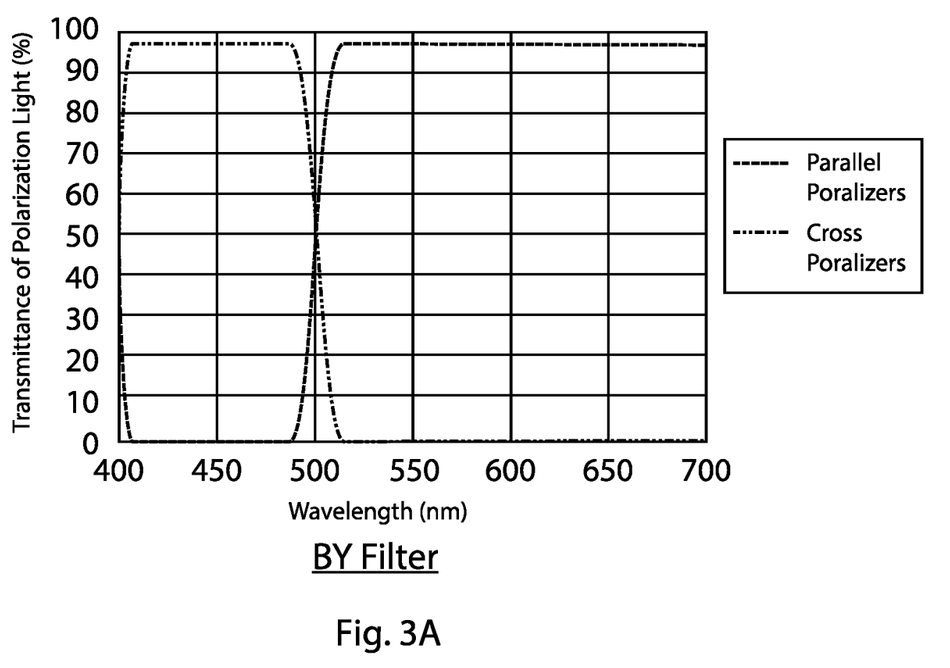
FIG. 3A illustrates the transmittance of a filter.
Figure 3B:
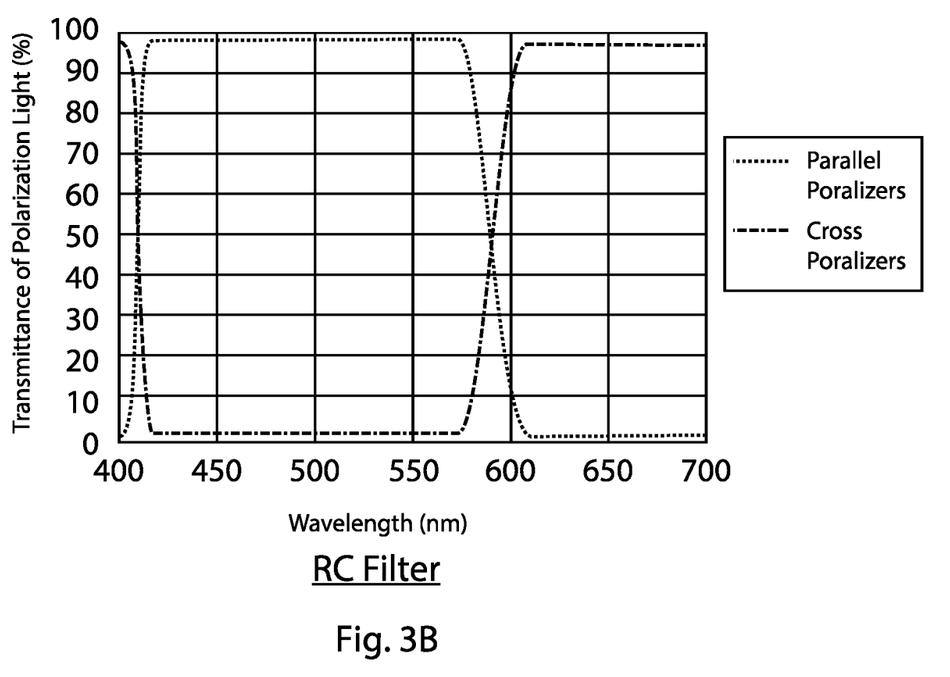
FIG. 3B illustrates the transmittance of a filter.

FIG. 3A shows an example of a curve of transmission through crossed polarizers of the first wavelength dependent half wave retarder plate 10 and FIG. 3B shows an example of a curve of transmission through crossed polarizers of the second wavelength dependent retarder plate 13. Wavelength dependent retarder plates are available commercially from several suppliers, example of precision manufacturers are ColorLink Ltd., Tokyo, Japan Ltd. and ImagineOptix, North Carolina, USA.

Figure 4:
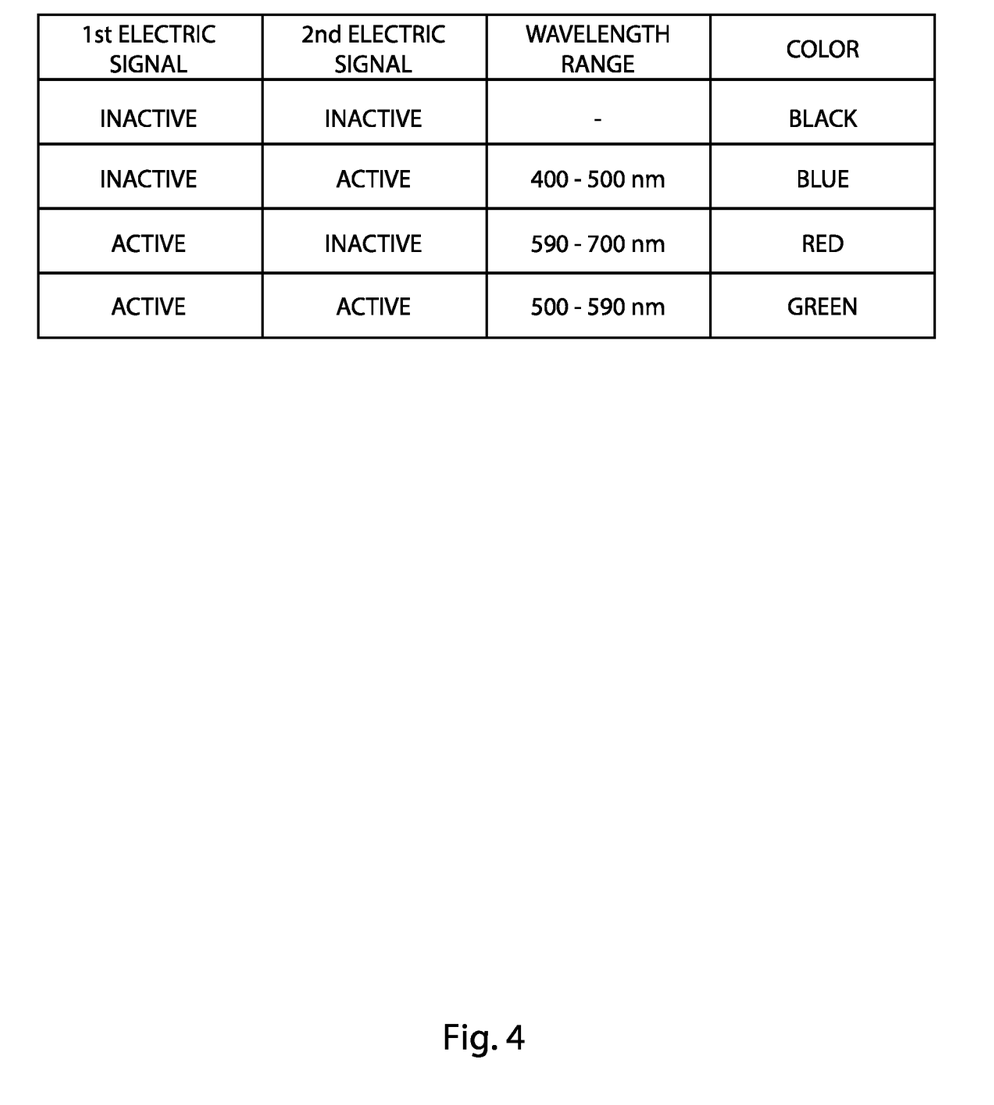
FIG. 4 illustrates the transmission through a switchable color filter.
Figure 5A:
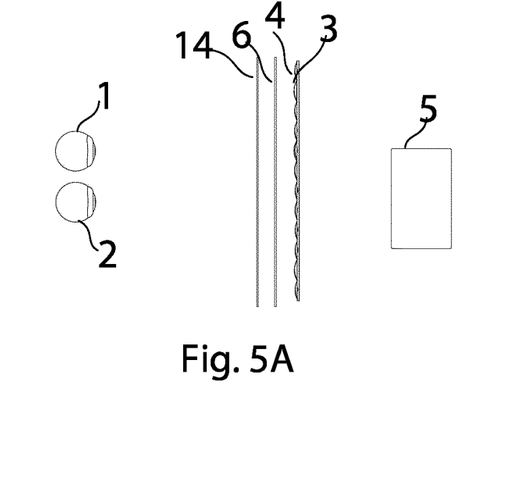
FIG. 5A illustrates a display according to an embodiment of the invention seen from the top.
Figure 5B:
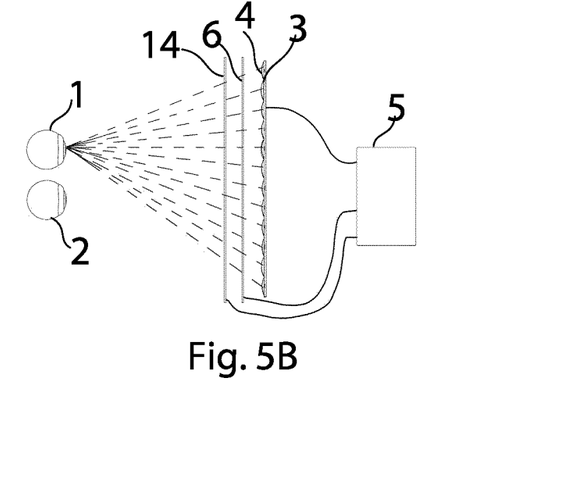
FIG. 5B illustrates a display according to an embodiment of the invention seen from the top.
Figure 5C:
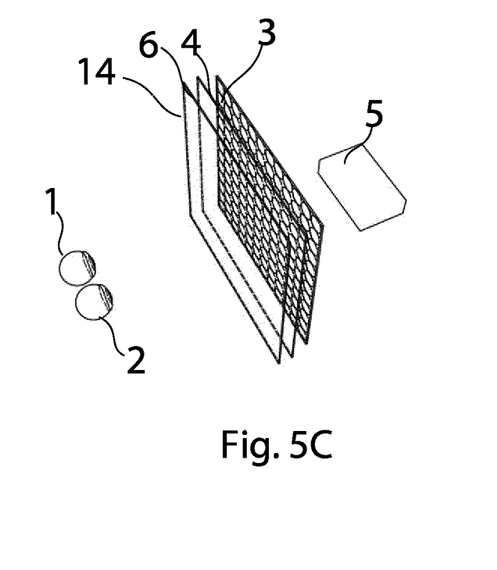
FIG. 5C illustrates a display according to an embodiment of the invention seen in a perspective view.
Figure 5D:
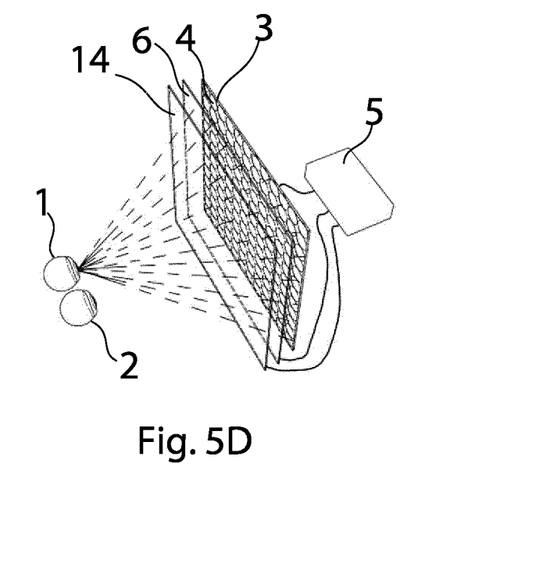
FIG. 5D illustrates a display according to an embodiment of the invention seen in a perspective view.

FIG. 4 shows a table of the resulting transmission through the switchable color filter 6 with different combinations of the first electric signal and the second electric signal when the first wavelength threshold is selected to 500 nm and the second wavelength threshold is selected to 590 nm.

FIG. 5 shows a schematic illustration of an embodiment of a second configuration of the invention similar to the first configuration shown in FIG. 1. and where in the second configuration an SLM 14 has been added, located in an optical path between the eye 1 and the first configuration and synchronized with the display 3 by the controller 5. FIGS. 5A and 5B shows a top view of the invention, with or without an indication of the illumination direction of the pixels, respectively. FIGS. 5C and 5D are perspective views of FIGS. 5A and 5B, respectively.

The SLM 14 may be a monochrome liquid crystal spatial light modulator capable of a high frame rate, for example 240 fps. The controller 5 may direct the display 3 and the switchable color filter 6 in a similar manner as described above with respect to FIG. 2 but in the second configuration it may be operated so it acts as a directional, color field-sequential backlight for the SLM 14. For example it may in a first time slot of a duty cycle display a uniform red image to the first eye 1, in a second time slot display a uniform green image to the first eye 1, in a third time slot display a uniform blue image to the first eye 1, in a fourth time slot display a uniform red image to the second eye 2, in a fifth time slot display a uniform green image to the second eye 2 and in a sixth time slot display a uniform blue image to the second eye 2. In the first time slot of the duty cycle it may direct the SLM 14 to display a red color plane of a first eye perspective image, in the second time slot it may direct the SLM 14 to display a green color plane of a first eye perspective image, in the third time slot it may direct the SLM 14 to display a blue color plane of a first eye perspective image, in the fourth time slot it may direct the SLM 14 to display a red color plane of a second eye perspective image, in the fifth time slot it may direct the SLM 14 to display a green color plane of a second eye perspective image and in a sixth time slot it may direct the SLM 14 to display a blue color plane of a second eye perspective image. Hence the first eye 1 may see a full color first eye perspective image and the second eye 2 may see a full color second eye perspective image. Additionally more perspective images may be shown to more eyes in a similar manner by extending the duty cycle with more time slots.

The display 3 and the SLM 14 may have a frame rate higher than 240 fps which may reduce color break up ("rainbow effect") when objects in the image move or when the gaze direction of an eye changes and which may further reduce flickering and strobing which may be distracting if the number of eyes and hence the number of shown images per duty cycle increases, since this will increase the duty cycle and hence reduce the experienced frame rate per eye if the synchronized frame rate of the display 3 and the SLM 14 is not increased.

The SLM 14 may comprise fast liquid crystal cells, for example comprising ferro electric liquid crystals. It may perform grayscale modulation by pulse width modulation or spatial modulation, for example dithering, or a combination hereof. For example it may comprise pixel electrodes of different sizes for binary coded spatial grayscale dithering. Additionally or alternatively it may use other dithering algorithms such as Floyd-Steinberg or minimized average error dithering.

The display 3 may be operated so that a first set of microlenses in a first area of the display 3 emit light in cones or other shapes essentially all having a first angle with respect to a perpendicular line going through the surface of the display 3 and so that a second set of microlenses in a second area of the display 3 emit light in cones or other shapes essentially all having a second angle with respect to a perpendicular line going through the surface of the display 3 and the first eye 1 and the second eye 2 may both be located farther away from the surface of the display 3 than a minimum distance, and the first angle and the second angle may be selected so light transmitted through the first set of microlenses and light transmitted through the second set of microlenses essentially reaches the first eye 1 and not the second eye 2. Hence the pixel patterns behind each microlens in the first set of microlenses may be essentially identical and the pixel patterns behind each microlens in the second set of microlenses may be essentially identical. This may greatly reduce the complexity of the pixel update circuitry in the display 3 and hence it may allow for a higher frame rate. Additionally it may allow for a higher pixel resolution which may result in a higher angular resolution of light transmitted through the microlenses. For example electrodes of pixels in corresponding positions behind microlenses in the first set of microlenses may be connected together and driving by a single pixel driver circuit, and similar for microlenses in the second set of microlenses. Alternatively or additionally pixel patterns behind microlenses in the first set of microlenses may be optically replicated and similarly for the second set of microlenses. The display may be segmented into more than two sets of microlenses. It may for example be segmented into a number of sets of microlenses selected essentially so the first eye 1 can be illuminated by all pixels all sets essentially without the second eye 2 being illuminated by any pixel. The pixel pattern may be a cluster, for example of four pixels, and the pixel fill factor may be high. Hence "dead" angles that cannot be illuminated may be reduced.

Figure 6:
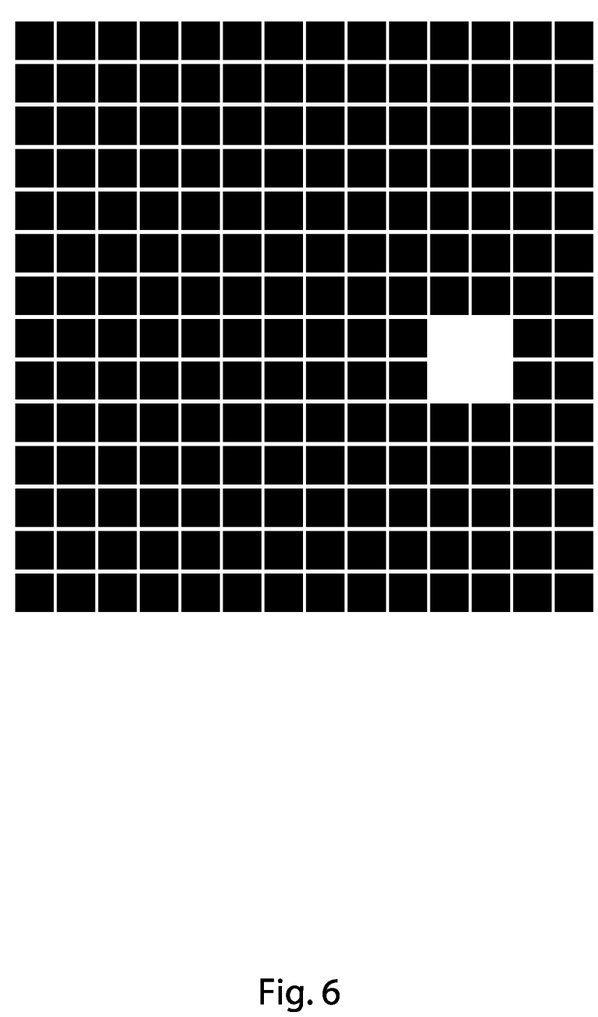
FIG. 6 illustrates the illumination of a cluster of four pixels.

FIG. 6 shows an example of a cluster of four pixels that are essentially equally illuminated. The display 3 may be an OLED display and the pixel fill factor may high enough that pixels are so close that lateral currents between electrodes form where pixel are illuminated so the part of the OLED stack between illuminated pixels also emits light. Hence a cluster of four pixel may "grow" together to form one essentially uniform light emitting area, so that essentially any angle can be covered and hence an eye cannot be in a "bad zone" where a pixel seems dark or dimmer or of a different color than intended. Alternatively or additionally a diffuser may be located between the surface of the display 3 and the microlens array 4. Alternatively or additionally an optical pixel pattern replication configuration may be configured so a pixel pattern to be replicated is slightly out of focus.

FIG. 7 shows an example of a configuration for optical replication of pixel patterns.

Figure 7A:
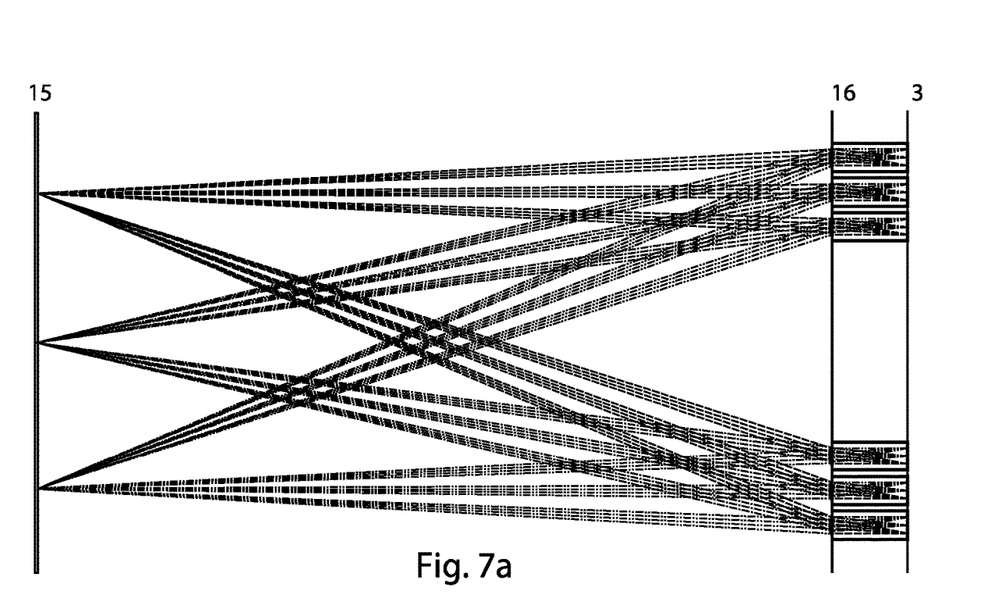
FIG. 7*a* illustrates a configuration for optical replication of a pixel pattern.
Figure 7B:
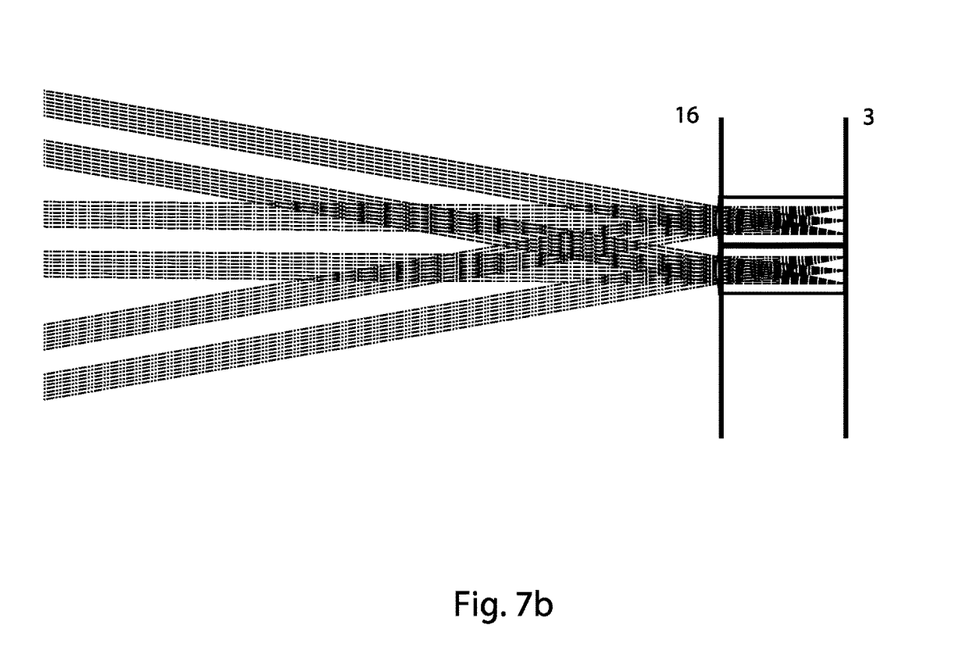
FIG. 7*b* illustrates a configuration for optical replication of a pixel pattern.
Figure 7C:
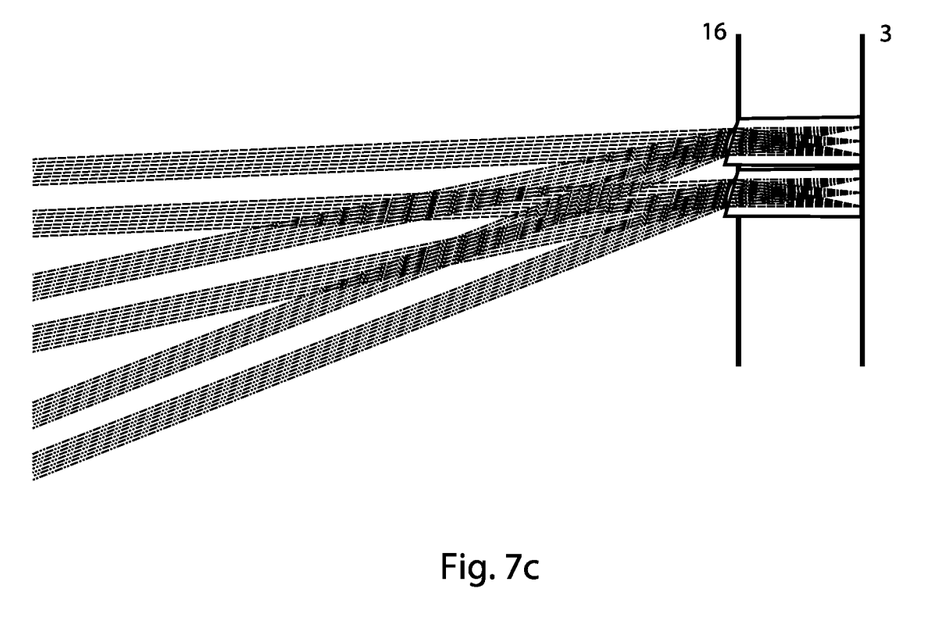
FIG. 7*c* illustrates a configuration for optical replication of a pixel pattern.

FIGS. 7a, 7b and 7c show an example of a configuration for optical replication of pixel patterns. The LED array 15, illuminates from the back, a segment of the OLED display stack, in which a second back illumination micro lens array 16 has been applied. Each back illumination micro lens in the said back illumination micro lens array focuses a 2D image of the full LED array 15 in its focal plane, where said OLED display stack 3 is placed, thereby optically triggering the OLED on/off corresponding to the 2D pattern of the LED array 15. As each back illumination micro lens in said back illumination micro lens array 16 sees the LED array 15 under a different off axis angle, but in preferred embodiment will focus the image of said LED array 15 onto only the part of the OLED stack 3 directly behind the same single back illumination micro lens, each back illumination micro lens will preferable have a separate form relative to its neighbors, as well has an distinct separate off axis aperture relative to its mathematical vertex, in order to achieve this off axis imaging and not illuminate the parts of the said OLED stack 3 which is located behind a neighbor back illumination micro lens.

In FIG. 7a only a few pairs of a plurality of the back illumination micro lenses are shown.

In FIG. 7b a close up of the pair of back illumination micro lenses closest to the center of the segment are shown. It is here difficult to see the off axis aperture form of the lens surfaces, as they are nearly on-axis being in the center of the segment.

In FIG. 7c a close up of the pair of back illumination micro lenses closest to the edge of the segment are shown, and the off axis aperture is seen clearly in the form of the lens surfaces In a preferred embodiment the single back illumination micro lens can be described mathematically as an off axis segment of an aspheric lens. One way of describing an aspheric lens mathematically is by the formula $$z(r) = \frac{r^2}{R\left(1 + \sqrt{1 - (1+\kappa)\frac{r^2}{R^2}}\right)} + \alpha_4 r^4 + \alpha_6 r^6 + \cdots,$$

(source: https://en.wikipedia.org/wiki/Aspheric lens), where r is the radial distance to the mathematical vertex of the lens, k is the konical constant, R the center Radius of curvature and the $\alpha_4$, $\alpha_6$ ... are the aspheric coefficients.

It should be understood that the above description uses examples as explanation for clarity, but the invention should not be limited to the examples but should be understood as including variations, modifications, combinations and additions such as are evident to a person skilled in the art of display technology and image processing.

Figure 8:
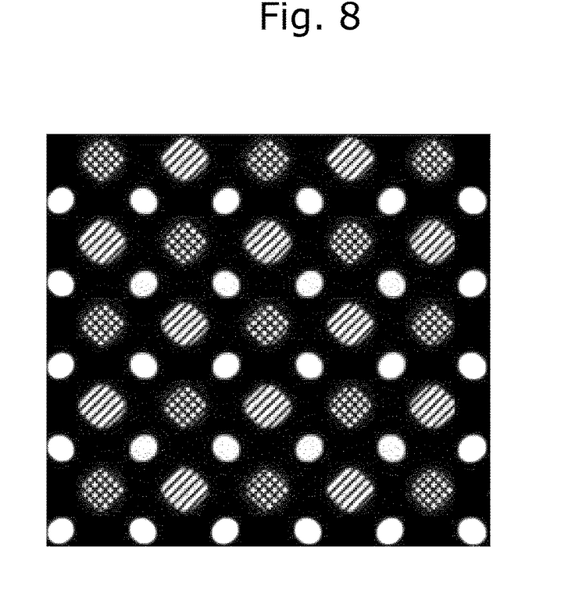
FIG. 8 illustrates a segment of a prior art OLED display.

FIG. 8 shows an example of a segment of a prior art OLED display comprising a color mask. The pixel pitch, i.e. the distance between centers of adjacent pixels, may be for example 425 micrometers. This may correspond to a resolution of said prior art OLED display of approximately 1920×1080 and the size of said prior art OLED display may be for 819 mm×458 mm, hence corresponding approximately to a diagonal width of 37 inches and an aspect ratio of 16:9. A pixel may comprise four sub-pixels, two green, one red and one blue. Hence the distance between the centers of two adjacent sub-pixels may be approximately 212.5 micrometers. A microlens may be located in front of a sub-pixel and may have a diameter so the area of the microlens can essentially be comprised with the area of the sub-pixel. For example the microlens may have a diameter essentially equal to half a distance between two adjacent sub-pixels. Hence the diameter may be 106.25 micrometers. A maximum allowed mounting tolerance may be for example 5% of the diameter of the microlens, hence may be app 5.3 micrometers.

Figure 9:
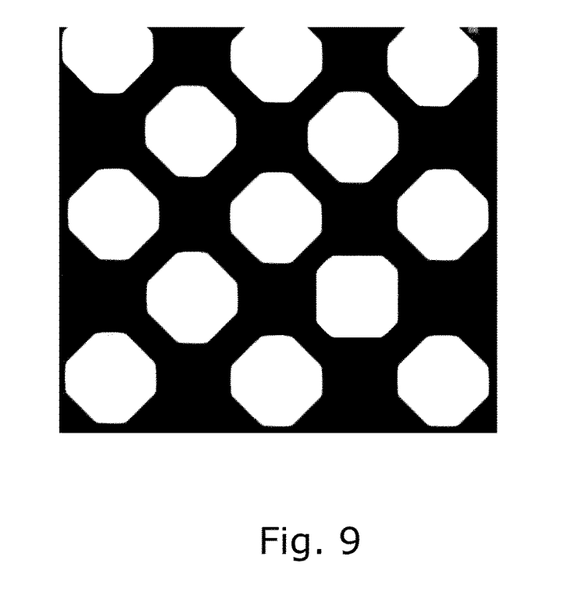
FIG. 9 illustrates a segment of the disclosed OLED display.

FIG. 9 shows an example of a segment of the disclosed OLED display which may have essentially same size and resolution as said prior art OLED display and hence approximately same pixel pitch. The pixel pitch, i.e. the distance between centers of adjacent pixels, may be for example 425 micrometers, corresponding to a display of essentially the same size and resolution as that of the prior art OLED display. In this example a microlens may be located in front of a pixel and may have a diameter so the area of the microlens can essentially be comprised with the area of the pixel. For example the microlens may have a diameter essentially equal to half a distance between two adjacent pixels. Hence the diameter may be 212.5 micrometers. A maximum allowed mounting tolerance may be for example 5% of the diameter of the microlens, hence may be app 10.6 micrometers. Hence an advantage of the disclosed invention is that allowed maximum mounting tolerances for microlenses may be doubled while essentially maintaining the performance parameters of a display.

Although the present invention has been described in connection with the specified embodiments, it should not be construed as being in any way limited to the presented examples. The scope of the present invention is set out by the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A display for directional control of an image to an observer, said display comprising:
   a plurality of image pixels,
   each image pixel defining an area having a plurality of subpixels,
   each subpixel being addressable for emitting light in a direction towards said observer,
   each pixel comprising
      a thin film stack of an electroluminescent layer for generating substantially white light,
      a color filter for transmitting a first wavelength or wavelength range of said substantially white light in a first time interval and a second wavelength or wavelength range substantially of said white light in a second time interval such that a color perceived by said observer being a combination of said first wavelength or wavelength range and said second wavelength or wavelength range,
      an optical element for focusing light from a sub pixel of said plurality of subpixels,
   said optical element having a focal point between said optical element and a point in front of and infinitely far away from said optical element,
   said optical element having a diameter greater than 30% of an image pixel pitch, and said display comprising a single optical element per image pixel.

2. The display according to claim 1, said substantially white light having a chromaticity in CIE 1931 xy chromaticity space of (x=0.2-0.4, y=0.2-0.4).

3. The display according to claim 1, said optical element arranged in front of said thin film stack relative to said observer.

4. The display according to claim 1, said optical element arranged between said thin film stack and said observer.

5. The display according to claim 1, said color filter arranged between said thin film stack and said optical element.

6. The display according to claim 1, said optical element having a diameter no greater than an image pixel pitch.

7. The display according to claim 1, said optical element having a diameter equal to half of said image pixel pitch +/−20%.

8. The display according to claim 1, said color filter filtering wavelengths different from said first wavelength or wavelength range in said first time interval.

9. The display according to claim 1, said pixel pitch being a distance between two neighboring pixels.

10. The display according to claim 1, the number of image pixels corresponding to the number of optical elements.

11. The display according to claim 1, comprising a first polarizer for polarizing said white light in a first polarization state.

12. The display according to claim 11, comprising
   an active optical device for changing the polarization state of light as a function of a control signal,
   an optical medium for changing the polarization state of light having a wavelength less than a first threshold,
   a second polarizer,
   said active optical device and said optical medium arranged between said first polarizer and said second polarizer, and
   a controller for controlling said electroluminescent layer, and said active optical device, said controller and said color filter being configured such that said pixel emitting light having a wavelength less than said first threshold in a first time window and emitting light having a wavelength greater than said first threshold in a second time window.

13. The display according to claim 12, said active optical device having a first active state for changing the polarization state of light when an electric field having a first set of characteristics being applied to said active optical device, and a first passive state for maintaining the polarization state of light when an electric field having a second set of characteristics being applied to said active optical device.

14. The display according to claim 13, said color filter being configured such that light having a wavelength less than said first threshold pass through said color filter when said active optical device being in said first active state, and light having a wavelength greater than said first threshold pass through said color filter when said active optical device being in said first passive state.

15. The display according to claim 14, said first polarizer and said second polarizer having orthogonal polarization directions.

16. The display according to claim 13, said color filter being configured such that light having a wavelength greater than said first threshold pass through said color filter when said active optical device being in said first active state, and light having a wavelength less than said first threshold pass through said color filter when said active optical device being in said first passive state.

17. The display according to claim 16, said first polarizer and said second polarizer having parallel polarization directions.

18. The display according to claim 12, said active optical device having a second active state for maintaining the polarization state of light when an electric field having a first set of characteristics being applied to said active optical device, and a second passive state for changing the polarization state of light when an electric field having a second set of characteristics being applied to said active optical device.

19. The display according to claim 18, said color filter being configured such that light having a wavelength less than said first threshold pass through said color filter when said active optical device being in said second active state, and light having a wavelength greater than said first threshold pass through said color filter when said active optical device being in said second passive state.

20. The display according to claim 19, said first polarizer and said second polarizer having orthogonal polarization directions.

21. The display according to claim 18, said color filter being configured such that light having a wavelength greater than said first threshold pass through said color filter when said active optical device being in said second active state, and light having a wavelength less than said first threshold pass through said color filter when said active optical device being in said second passive state.

22. The display according to claim 21, said first polarizer and said second polarizer having parallel polarization directions.

23. The display according to claim 1, said substantially white light comprising no less of red color component or intensity than 20% compared to any of color component or intensity of blue or green.

24. The display according to claim 11, said polarization state comprising elliptical polarization or linear polarization.

25. The display according to claim 12, said color filter comprising
   a second active optical device for changing the polarization state of light,
   a second optical medium for changing the polarization state of light having a wavelength less than a second threshold, and
   a third polarizer.

26. The display according to claim 25, said second polarizer being closer to said electroluminescent layer than said third polarizer.

27. The display according to claim 25, said second active optical device and second optical medium arranged between said second polarizer and said third polarizer.

28. The display according to claim 25, said second threshold being higher than said first threshold.

29. The display according to claim 25, said controller and said color filter being configured such that said pixel emitting light having a wavelength less than said first threshold in said first time window and emitting light having a wavelength between said first threshold and said second threshold in a second time window, and emitting light having a wavelength greater than said second threshold in a third time window.

30. The display according to claim 29, said first time window, said second time window, and said third time window each having a length such that the color perceived by said observer color being a combination of said wavelength less than said first threshold, said wavelength between said first threshold and said second threshold, and said wavelength greater than said second threshold when said pixel emitting light having said wavelength less than said first threshold in said first time window followed by emitting light having said wavelength between said first threshold and said second threshold in said second time window, followed by emitting light having said wavelength greater than said second threshold in said third time window.

31. The display according to claim 29, said first time window, said second time window or interval, and said third time window each having a length between 0.01 ms and 20 ms.

32. The display according to claim 12, wherein the active optical device is a liquid crystal cell.

33. The display according to claim 31, wherein said first time window, said second time window or interval, and said third time window each having a length between 0.1 ms and 1 ms.

* * * * *